United States Patent
Kermalli et al.

(10) Patent No.: US 10,622,736 B2
(45) Date of Patent: Apr. 14, 2020

(54) HARMONIC TERMINATION INTEGRATED PASSIVE DEVICE

(71) Applicant: Futurewei Technologies, Inc., Plano, TX (US)

(72) Inventors: Munawar Kermalli, Morris Plains, NJ (US); Michael Russo, Morris Plains, NJ (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 16/031,680

(22) Filed: Jul. 10, 2018

(65) Prior Publication Data
US 2020/0021046 A1 Jan. 16, 2020

(51) Int. Cl.
| | |
|---|---|
| *H01R 12/57* | (2011.01) |
| *H01R 12/70* | (2011.01) |
| *H01R 43/02* | (2006.01) |
| *H01R 12/71* | (2011.01) |

(52) U.S. Cl.
CPC ........... *H01R 12/57* (2013.01); *H01R 12/707* (2013.01); *H01R 12/716* (2013.01); *H01R 43/0256* (2013.01)

(58) Field of Classification Search
CPC .. H01R 12/57; H01R 43/0256; H01R 12/716; H01R 12/707
See application file for complete search history.

(56) References Cited

U.S. PATENT DOCUMENTS

| | | | | |
|---|---|---|---|---|
| 6,238,949 B1 * | 5/2001 | Nguyen | ................ | H01L 21/565 257/777 |
| 7,253,511 B2 * | 8/2007 | Karnezos | ................ | H01L 25/03 257/686 |
| 7,427,535 B2 * | 9/2008 | Vaiyapuri | ............. | H01L 21/563 257/E21.503 |

(Continued)

FOREIGN PATENT DOCUMENTS

| | | |
|---|---|---|
| CN | 108242920 A | 7/2018 |
| WO | 2012160755 A1 | 11/2012 |
| WO | 2017203571 A1 | 11/2017 |

OTHER PUBLICATIONS

IEEE Communications Magazine, Guest Editorial, "Key Technology for 5G New Radio", Mar. 2018, pp. 10-11.

(Continued)

*Primary Examiner* — Karen Kusumakar
(74) *Attorney, Agent, or Firm* — Slater Matsil, LLP

(57) ABSTRACT

A radio frequency (RF) device includes a first and second substrate, a first and second circuit, and an interconnect circuit. Each substrate having a first surface and an opposing second surface, a thickness of the second substrate being greater than a thickness of the first substrate, the second substrate having an overhang portion extending over the first surface of the first substrate. The first circuit disposed on the first substrate having a first contact terminal on the first surface of the first substrate. The second circuit disposed on the second substrate, the second circuit having a second contact terminal on the first surface of the second substrate. The interconnect circuit disposed on the overhang portion of the second substrate. The interconnect circuit including a vertical metal structure electrically connecting the first contact terminal to the second contact terminal.

20 Claims, 7 Drawing Sheets

(56) References Cited

U.S. PATENT DOCUMENTS

| | | | |
|---|---|---|---|
| 8,981,574 B2* | 3/2015 | Kim | H01L 24/73 |
| | | | 257/777 |
| 9,979,361 B1 | 5/2018 | Mangaonkar et al. | |
| 2007/0007643 A1* | 1/2007 | Oh | H01L 23/49827 |
| | | | 257/701 |
| 2012/0175643 A1 | 7/2012 | West | |
| 2013/0106519 A1 | 5/2013 | Kamiyama et al. | |
| 2016/0173039 A1 | 6/2016 | Frei et al. | |

OTHER PUBLICATIONS

Khanduri, R. et al., "Performance Comparison Analysis between IEEE 802.11a/b/g/n Standards", International Journal of Computer Applications (0975-8887), vol. 78—No. 1, Sep. 2013, p. 13-20.

Lin, X. et al., "5G New Radio: Unveiling the Essentials of the Next Generation Wireless Access Technology", Ericsson, Jun. 18, 2018, 8 pages.

Babiker Mohammed Abdelrahman, R., et al. "A Comparison between IEEE 802.11a, b, g, n, and ac Standards", IOSR Journal of Computer Engineering (IOSR-JCE), e-ISSN: 2278-0661, p-ISSN, vol. 17, Issue 5, Ver. III, Sep.-Oct. 2015, pp. 26-29.

\* cited by examiner

HARMONIC TERMINATION INTEGRATED PASSIVE DEVICE

TECHNICAL FIELD

The present disclosure relates generally to a radio frequency electronic device, and, in particular embodiments, to radio frequency electronic device packages and component interconnects in radio frequency electronic devices.

BACKGROUND

A typical phased array radar system includes an array of radio frequency (RF) modules connected to an array of radio wave emitting antenna elements. Each RF module receives an RF signal, adjusts the phase of the RF signal using a phase shifter, amplifies the RF signal using a power amplifier, and radiates the RF signal outwards through the radio wave emitting antenna elements. Various methods and components are introduced in a phased array radar system to reduce power operating requirements and improve system efficiency. One such method is to improve the efficiency of power amplifiers using one or more harmonic termination devices in the radiating circuit. The harmonic termination device improves efficiency by providing an RF short circuit at the second harmonic frequency and a matching impedance at the fundamental operating frequency of the power amplifier of the RF module.

SUMMARY

Technical advantages are generally achieved by embodiments of this disclosure, which describes a radio frequency electronic device package and component interconnects in radio frequency electronic devices.

In accordance with an embodiment, a radio frequency (RF) device is provided. The RF device includes a first and a second substrate, a first and second circuit, and an interconnect circuit. The first and second substrate, each having a first surface and an opposing second surface, a thickness of the second substrate being greater than a thickness of the first substrate, the second substrate having an overhang portion extending over the first surface of the first substrate. The first circuit is disposed on the first substrate. The first circuit having a first contact terminal on the first surface of the first substrate. The second circuit is disposed on the second substrate. The second circuit having a second contact terminal on the first surface of the second substrate. The interconnect circuit is disposed on the overhang portion of the second substrate. The interconnect circuit includes a vertical metal structure electrically connecting the first contact terminal to the second contact terminal. In one example, the first circuit is an amplifier circuit, the first contact terminal is a control terminal of the amplifier circuit, and the second circuit is a harmonic termination device. The harmonic termination device is designed to provide a short circuit termination with a reflection coefficient of −1 at a second harmonic of a fundamental operating frequency of the amplifier circuit. Optionally, in such an example, or in another example, the second substrate is a glass substrate and the harmonic termination device includes capacitors and inductors formed using via structures and metal layers within the second substrate. Optionally, in any one of the above mentioned examples, or in another example, the vertical metal structure is a metal plated via through hole. Optionally, in any one of the above mentioned examples, or in another example, the vertical metal structure electrically connects the first contact terminal to the second contact terminal using a conductive epoxy. Optionally, in any one of the above mentioned examples, or in another example, a thickness of the conductive epoxy is equal to a gap between the overhang portion of the second substrate and the first surface of the first substrate. Optionally, in any one of the above mentioned examples, or in another example, the RF device further includes a plurality of isolation via structures on the overhang portion of the second substrate.

In accordance with another embodiment, an electronic device is provided. The electronic device includes a first substrate, a second substrate, and a third substrate, each substrate having a first surface and an opposing second surface and a thickness of the second substrate being greater than a thickness of the first substrate. The electronic device further includes a first circuit, a second circuit, and an interconnect circuit. The first circuit is disposed on the first substrate. The first circuit having a first contact terminal on the first surface of the first substrate. The second circuit is disposed on the second substrate. The second circuit having a second contact terminal on the first surface of the second substrate. The interconnect circuit is disposed on the third substrate. The interconnect circuit includes vertical metal structures electrically connecting the first contact terminal to the second contact terminal. In one example, the first circuit is an amplifier circuit, the first contact terminal is a control terminal of the amplifier circuit, and the second circuit is a harmonic termination device. The harmonic termination device is designed to provide a short circuit termination with a reflection coefficient of −1 at a second harmonic of a fundamental operating frequency of the amplifier circuit. Optionally, in such an example, or in another example, the harmonic termination device includes capacitors and inductors formed using via structures and metal layers within the second substrate. Optionally, in any one of the above mentioned examples, or in another example, the second substrate and the third substrate are each a glass substrate. Optionally, in any one of the above mentioned examples, or in another example, each vertical metal structure is a metal plated via through hole. Optionally, in any one of the above mentioned examples, or in another example, each vertical metal structure electrically connects the first contact terminal to the second contact terminal using a conductive epoxy. Optionally, in any one of the above mentioned examples, or in another example, the vertical metal structure is a C shaped metal structure having a first surface, a second surface, and a third surface. The first surface opposes the second surface and the third surface is perpendicular to the first surface. The second surface, each of the first surface, the second surface, and the third surface are metal plated.

In accordance with yet another embodiment, A radio frequency (RF) device is provided. The RF device includes a first substrate and a second substrate. The first substrate includes a contact terminal. The second substrate includes a first and second surface, a first and second section, and a vertical metal structure. The second surface opposing the first surface. The first section is located between the first surface and the second surface. The first section has a first width. The second section is located between the first surface and the first section. The second section has a second width less than the first width. The vertical metal structure electrically connects the second surface of the second substrate to the contact terminal of the first substrate. In one example, the first substrate is an active device and the second substrate is a passive device. Optionally, in such an example, or in another example, the first section overlaps the first substrate. Optionally, in any one of the above mentioned examples, or in another example, the vertical metal structure is a metal plated via through hole. Optionally, in any one of the above mentioned examples, or in another example, the vertical metal structure is electrically connected to the contact terminal of the first substrate using a conductive epoxy. Optionally, in any one of the above mentioned examples, or in another example, the first substrate is a power amplifier, the contact terminal is a control terminal of the power amplifier, and the second substrate is a harmonic termination device designed to provide a short circuit termination with a reflection coefficient of −1 at a second harmonic of a fundamental operating frequency of the power amplifier.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

Figure 1:
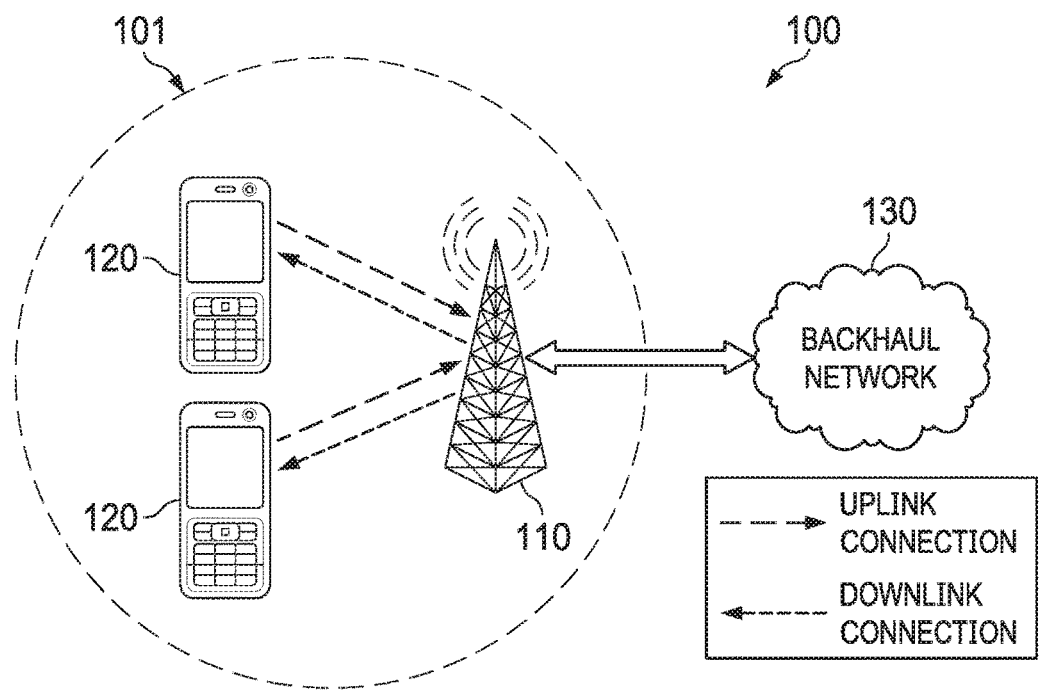
FIG. 1 is a diagram of an embodiment wireless communications network.

This disclosure provides many applicable inventive concepts that can be embodied in a wide variety of specific contexts. The specific embodiments are merely illustrative of specific configurations and do not limit the scope of the claimed embodiments. Features from different embodiments may be combined to form further embodiments unless noted otherwise. Variations or modifications described with respect to one of the embodiments may also be applicable to other embodiments.

Phased array antennas are suitable for use in a number of applications, such as telecommunications, automotive radar, industrial radar, gesture sensors, and motion detectors. In telecommunication applications, multichannel transceivers may be used for point-to-point communication where beamforming is needed. For example, upcoming 5$^{th}$ generation (5G) mobile technologies may employ various features that utilize multiple antenna elements such as adaptive beamforming for dedicated users, smart antenna scenarios, transmit diversity, and multiple input, multiple output (MIMO) configurations.

The present disclosure will be described with respect to embodiments in a specific context, radio frequency (RF) device modules in a phased array antenna that may be used in RF systems such as radar systems and cellular communication systems. Although many embodiments of this disclosure are described in the context of the components of the RF device module such as a power amplifier and a harmonic termination device, it should be appreciated that such embodiments may also be implemented in other active and passive electronic components.

A power amplifier is an active component in an RF device module that amplifies an RF input signal using, for example, direct current (DC) biasing circuitry. The RF input signal to the power amplifier may be a modulated signal that has been up-converted to be transmitted in a communications band, such as a band centered at 2.14 Gigahertz (GHz). The biasing circuit may use an external power source to set the operating point of the transistors. A variety of manufacturing technologies and materials may be used to design and build a power amplifier. Some examples of materials used to fabricate a power amplifier are gallium arsenide (GaAs) or gallium nitride (GaN).

A harmonic termination device is used at an input (e.g., gate) or an output (e.g., drain) of a transistor of a power amplifier to improve its operating efficiency (i.e., power added efficiency (PAE)). At the input of the transistor, the harmonic termination device provides a matching impedance at the fundamental operating frequency of the power amplifier and a short circuit at the second harmonic of the power amplifier. Ideally, the voltage standing wave ration (VSWR) of a short circuit load has a magnitude equal to 1 with a phase of 180 degrees (i.e., reflection coefficient=−1). However, in a typical RF module device, where the power amplifier transistor makes an electric connection with the harmonic termination device using a ball bond or a wirebond process, the short circuit load may be non-ideal—skewing in phase by several degrees. The ball bond or the wirebond, making the connection between the power amplifier transistor and the harmonic termination device, adds parasitics and an unwanted transformation component to the RF transition. This in turn adds an additional phase, which skews phase of the short circuit by several degrees, resulting in a non-ideal RF short circuit load for the power amplifier transistor.

In a typical manufacturing facility with an emphasis on manufacturability and producability, variations exist in the physical shape of wirebonds/ball bonds used as electrical interconnects between components. In addition, due to the inherent limitations of the bonding process, the wirebond/ball bond have a loop characteristic, which adds an additional variability to the length/inductance of the wirebond. Furthermore, processing variations, such as physical distances between components can add to the length of the wirebond/ball bond and its looping characteristic. Each of these and other factors result in variations in the length, shape, inductance, reactance, resistance, etc. of the wirebond/ball bond. These variations in turn have result in variations in phase of the RF transition at the interconnect. These variations in phase are undesirable in RF transitions and in some cases can significantly impact the performance and efficiency of the RF device. Thus, a low cost interconnect replacement with a controllable electrical length is advantageous and desirable. Embodiments of this disclosure provide an interconnect structure that presents a more ideal matching impedance at the fundamental operating frequency and a more ideal short circuit termination load at the second harmonic of the power amplifier, for example, between a transistor and a harmonic termination device.

FIG. 1 is diagram of a network 100 for communicating data. The network 100 includes a base station 110 having a coverage area 101, a plurality of UEs 120, and a backhaul network 130. As shown, the base station 110 establishes uplink (dashed line) and/or downlink (dotted line) connections with the UEs 120, which serve to carry data from the UEs 120 to the base station 110 and vice-versa. Data communicated over the uplink/downlink connections may include data communicated between the UEs 120, as well as data communicated to/from a remote-end (not shown) by way of the backhaul network 130. As used herein, the term "base station" refers to any network-side device configured to provide wireless access to a network, such as an enhanced Node B (eNodeB or eNB), agNB, a transmit/receive point (TRP), a macro-cell, a femtocell, a Wi-Fi Access Point (AP), and other wirelessly enabled devices. Base stations may provide wireless access in accordance with one or more wireless communication protocols, e.g., $5^{th}$ generation new radio (5G NR), LTE, LTE advanced (LTE-A), High Speed Message Access (HSPA), Wi-Fi 802.11a/b/g/n/ac, etc. As used herein, the term "UE" refers to any user-side device configured to access a network by establishing a wireless connection with a base station, such as a mobile device, a mobile station (STA), a vehicle, and other wirelessly enabled devices. In some embodiments, the network 100 may include various other wireless devices, such as relays, low power nodes, etc.

Figure 2:
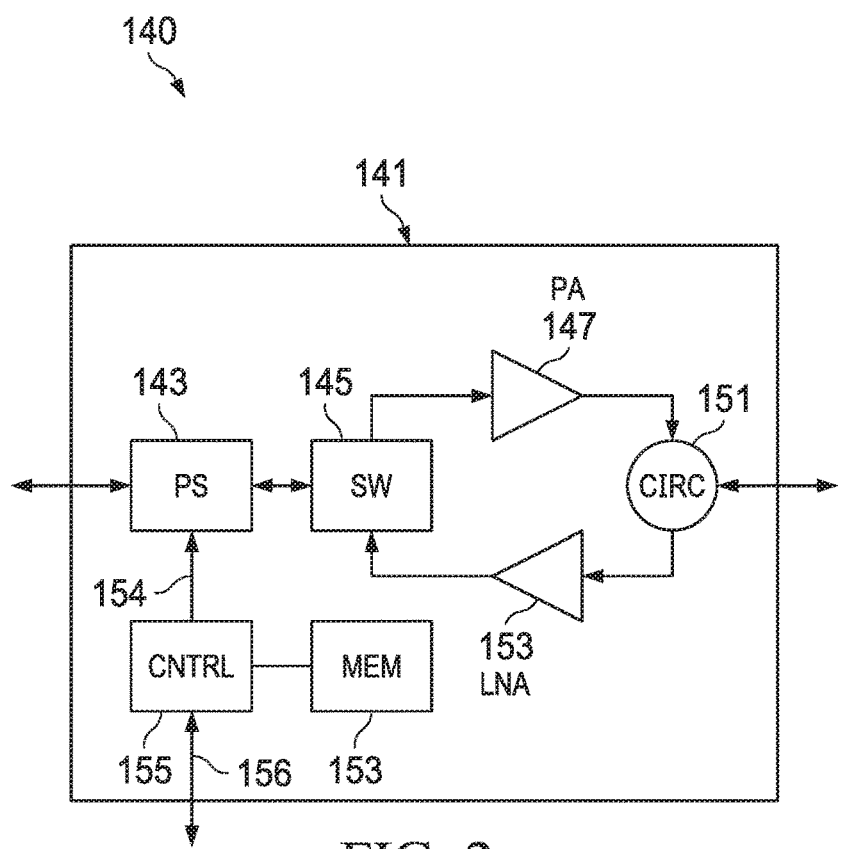
FIG. 2 illustrates a block diagram of an embodiment radio frequency (RF) module.

FIG. 2 illustrates a block diagram of an embodiment radio frequency (RF) module 140 that includes a phase shifter 143, a switch 145, a power amplifier (PA) 147, a low noise amplifier (LNA) 153, a circulator 151, a controller 155, and a memory 157 in an RF device package 141. The RF device package 141 provides mechanical support, environmental protection, and thermal support. A non-limiting example of the RF device package 141 may be a multi-layered ceramic enclosure such as a high temperature co-fired ceramic (HTCC) multilayer package or a low temperature co-fired ceramic (LTCC) multilayer package. Other suitable housing material would be recognized by those of ordinary skill in the art.

The RF module 140 is a component of the base station 110, as shown in FIG. 1 and the base station 110 may include several RF modules to operate. In FIG. 2, the RF module 140 is shown as having a single RF channel; however, an RF module with more than one RF channel may also be contemplated. The arrangements of the components in the RF module 140 illustrate an embodiment configuration and other configurations are possible, such as having the circulator 151 external to the RF module 140 or having a second switch instead of the circulator 151. Additionally, one or more components of the RF module 140 may be integrated in a single chip, or may be provided in separate chips. As an example, the phase shifter 143 and the switch 145 may be integrated in a single semiconductor chip. In an RF module 140, integrating the various components on a single chip may be impractical owing to, for example, each component using a different semiconductor technology or by reasons of component design, component cost, etc. As an example, the power amplifier 147 may be formed by a gallium nitrite (GaN) process while the switch 145, for cost reasons, may be formed by a gallium arsenide (GaAs) process. It is typical in such configurations, where the two components are not integrated on a same chip to make the electrical contact between the components using gold (AU) wire bonds or gold (AU) ribbon bond technology.

In the RF module 140, the phase shifter 143 is used to change the phase angle of the received signal. The phase shifter 143 is typically controlled using a control signal 154 to set the value of the phase shifter 143 in accordance with the desired change in phase angle. The control signal 154 may be communicated to the phase shifter using a controller 155. The controller 155 may be a separate component such as an application specific integrated circuit (ASIC), a microcontroller, a field programmable gate array (FPGA), or any other device capable of controlling the phase shifter 143. The controller 155 may use information stored in the memory 157 to determine the appropriate phase of the phase shifter 143. In some embodiments, the controller 155 may receive data signals 156 from an external device to the RF module 140 and set the appropriate values for the phase shifters 143.

In the transmit path, the switch 145 is set for an RF signal to be received at the power amplifier 147. The power amplifier 147 may be a variable gain amplifier (VGA) or in some embodiments may consist of an attenuator and an amplifier, arranged as separate components. In either configuration, the power amplifier 147 amplifies the received signal in accordance with a gain value that may be adjusted through a control signal 154 using, for example, the controller 155 and the memory 157. The load at the input and output of the power amplifier 147 may impact the efficiency of the power amplifier.

As previously disclosed, in an ideal configuration, the load presented to a transistor in the power amplifier 147 is designed to match the impedance of the transistor at the fundamental operating frequency of the transistor output signal. In some embodiments, the power amplifier 147 may include matching circuits and/or harmonic termination circuits to improve the efficiency of the transistors of the power amplifier 147. The circulator 151 receives an amplified RF signal from the power amplifier 147 and directs the signal to an antenna element to be radiated by the base station 110.

In receive mode, the circulator 151 receives an RF signal and directs the received RF signal to the LNA 153. The LNA 153 receives and amplifies the RF signal without degrading the signal-to-noise ratio. The LNA 153 may also attenuate the received signal using, for example, using an RF limiter type circuit as part of the LNA 153 or as a separate component. The switch 145 is set for the signal, amplified by the LNA 153, to be received by the phase shifter 143. The phase shifter 143 is generally a reciprocal network circuit, meaning that in a two-port RF circuit, the resulting phase angle change is applied at a signal received at either port of the phase shifter 143. However, in some embodiments, the transmit path and the receive path may have separate phase shifters. Similar to the transmit path, the phase shifter 143 in the receive path can be controlled using, for example, the controller 155, the memory 157, and/or an external data input 156.

Figure 3:
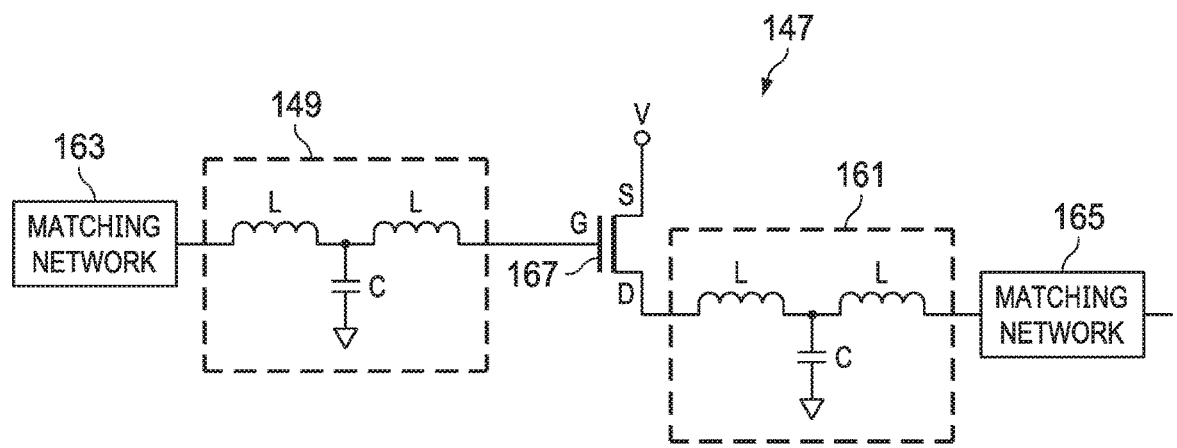
FIG. 3 illustrates a schematic of an embodiment amplifier circuit.

FIG. 3 illustrates a schematic of an embodiment amplifier circuit including an input matching network 163, an input harmonic termination device 149, a field-effect transistor (FET) 167, an output harmonic termination device 161, and an output matching network 165. Each of the input harmonic termination device 149 and the output harmonic termination device 161 can include metal layers of integrated passive devices and/or parallel plate capacitors using, for example, a high dielectric substrate material.

The input harmonic termination device 149 and the output harmonic termination device 165 are passive devices, and each device includes an RF transmission line connected to capacitors and inductors. In some embodiments, a gate (G) node of the transistor 167 in the power amplifier 147 may be connected to an RF transmission line of the input harmonic termination device 149. In various embodiments, a drain (D) node of the transistor 167 in the power amplifier 147 may be connected to an RF transmission line of the output harmonic termination device 161.

At the RF connection between the transistor 167 and the input harmonic termination device 149, a short circuit termination at the second harmonic of the RF input signal is reflected back into the transistor 167—the second harmonic generated at the gate (G) of the transistor 167 in the power amplifier 147. The reflected signal is mixed with the original RF input signal to generate current and voltage waveforms at the output of the transistor 167. The reflected signal and the original signal having minimal overlap, resulting in minimal power dissipation at the power amplifier 147. Thus, the input harmonic termination device 149 can improve the power added efficiency (PAE) of the power amplifier 147. Similarly, the output harmonic termination device 161 may be designed to present a specific impedance at the drain (D) of the transistor 167 to improve the operation of the power amplifier 147.

The matching networks 163 and 165 provide a matching impedance at the input and output of the transistor 167. The matching networks 163 and 165 can include LC networks, transmission line matching, etc. and are used to adjust power transfer and signal reflection with the transistor 167 of the power amplifier 147. As an example, the output matching network 165 may be designed to maximize power transfer at the output of the transistor 167 and minimize signals being reflected back to the transistor 167.

Each of the input harmonic termination device 149 and the output harmonic termination device 161 includes one or more capacitors and inductors in parallel or in series with each other, creating for example an LCL network.

The LCL network of the input harmonic termination device 149, is designed to create a matching impedance at the fundamental operating frequency of the transistor 167 and a short circuit termination at the second harmonic of the transistor 167.

The LCL network of the output harmonic termination device 161 is designed to create a matching impedance at the fundamental operating frequency and a reflection at an arbitrary phase at the second harmonic of the input RF signal. The optimum angle for the reflection of the second harmonic for the output can vary depending on the technology and size of the transistor 167 in the power amplifier 147.

In some embodiments, the power amplifier 147 may be connected to an input harmonic termination device 149 and not the output harmonic termination device 161. In some embodiments, the power amplifier 147 may be connected to the output harmonic termination device 161 and not the input harmonic termination device 149. In some other embodiments, the power amplifier 147 may be connected to both the input harmonic termination device 149 and the output harmonic termination device 161, as illustrated. Although the following embodiments are described with respect to the input harmonic termination device 149, these embodiments may apply to any of the aforementioned configurations and are non-limiting in application.

Figure 4:
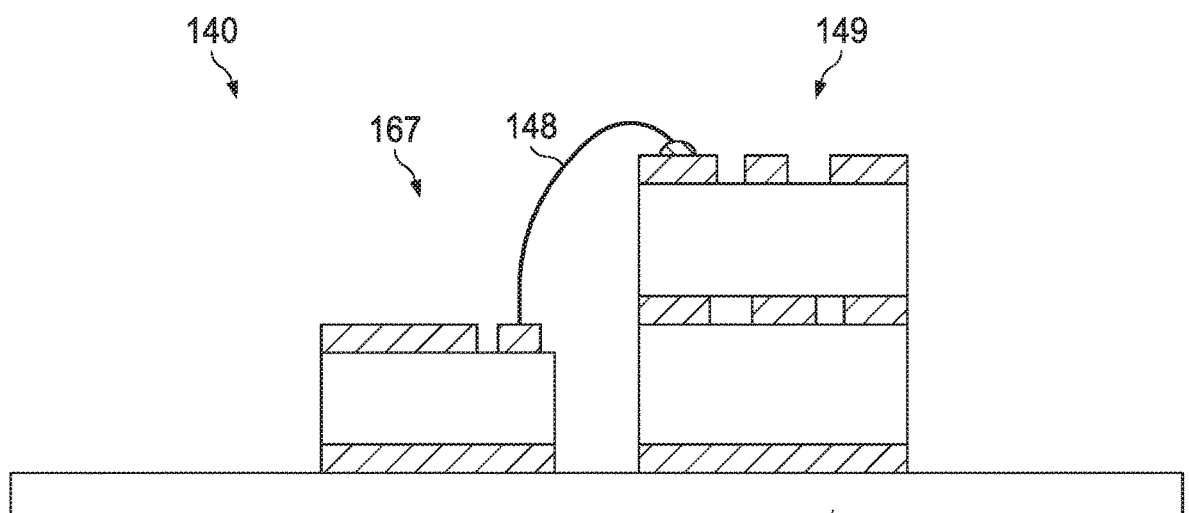
FIG. 4 illustrates a cross-sectional view of an embodiment circuit including a transistor electrically connected to a harmonic termination device using a bond wire.

FIG. 4 illustrates a cross-sectional view of an embodiment circuit including the transistor 167 electrically connected to the input harmonic termination device 149 using a bond wire 148. As illustrated, the transistor 167 and the input harmonic termination device 149 are mounted to a conductive surface 171 of the RF device package 141 of the RF module 140. In some embodiments, the transistor 167 may be mounted to the conductive surface 161 using a conductive epoxy. In an embodiment, the transistor 167 is mounted to the conductive surface 161 using solder. Similarly, the input harmonic termination device 149 may be mounted to the conductive surface using conductive epoxy or solder.

The bond wire 148 makes contact at the contact pads of the input harmonic termination device 149 and the transistor 167. In some embodiments, the contact pads may be suitably finished to provide for proper contact with the bond wire 148. As an example, the finish may include nickel (Ni) and gold (Au) to minimize transition losses. The bond wire 148 transition limits the type of harmonic termination that can be achieved at the transistor plane of the power amplifier. The bond wire 148 provides an electrical connection between the transistor 167 and the input harmonic termination device 149. The bond wire 148 presents an unwanted transformation component to the RF transition between the input harmonic termination device 149 and the transistor 167. The unwanted transformation shifts the impedance and away from the ideal short circuit termination desired at the second harmonic by, for example, several degrees in phase—depending on the frequency of the RF input signal.

Figure 5A:
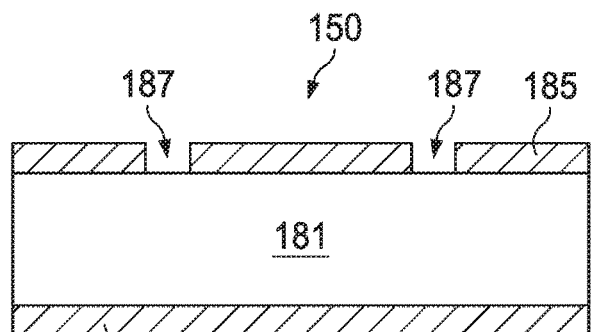
FIGS. 5A-C illustrate cross-sectional views of an embodiment harmonic termination integrated passive device.

FIG. 5A illustrates a cross-sectional view of a harmonic termination integrated passive device 150 after forming a lower conductive layer 183 over a first surface of a lower substrate layer 181. A middle conductive layer 185 may be formed over a second surface of the lower substrate layer 181. The first surface and the second surface of the lower substrate layer 181 are opposing of each other. In various embodiments, the lower conductive layer 183 may be a ground plane for the harmonic termination integrated passive device 150.

The middle conductive layer 185 may be patterned using an etching technique to form openings 187. The middle conductive layer 185 may have several openings 187 to form individual metal surfaces for the capacitive plates and/or embedded spiral inductors of the LC network of the harmonic termination integrated passive device 150.

The middle conductive layer 185 and the lower conductive layer 183 may be a metal foil, a metal layer, or any type of metallization laminated to the lower substrate layer 181. In some embodiments, the middle conductive layer 185 is copper (CU). In some embodiments, the lower conductive layer is made of copper (CU).

The lower substrate layer 181 may be a low-loss high frequency material such as a woven glass reinforced hydrocarbon ceramic and/or polytetrafluoroethylene (PTFE), RO4003 material, RO4350 material, or similar types of products. In some embodiments, the lower substrate layer 181 may be a commercial laminate material manufactured with copper cladding on one or both of the first and second opposing surfaces.

In some embodiments, the vertical thickness of the lower substrate layer 181 may be between 100 and 200 microns. As an example, in a harmonic termination integrated passive device 150 operating at a fundamental frequency of 2 GHz, the vertical thickness of the lower substrate layer 181 may be 100 microns. Specifically, the vertical thickness of the lower substrate layer 181 may be chosen to achieve, at an interconnect with the transistor 167, a matching impedance at the fundamental operating frequency and a short circuit termination load for the second harmonic frequency.

Figure 5B:
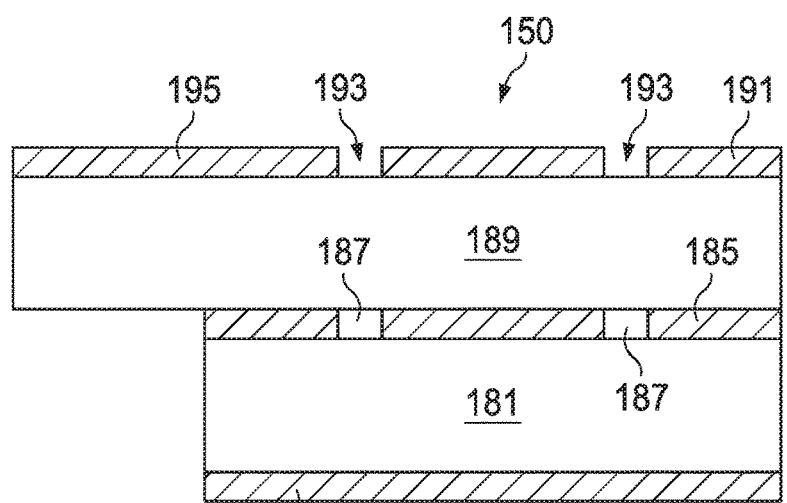

FIG. 5B illustrates a cross-sectional view of the harmonic termination integrated passive device 150 after forming an upper conductive layer 191 over a first surface of an upper substrate layer 189. In some embodiments, the upper substrate layer 189 and the upper conductive layer 191 may be formed over the middle conductive layer 185 by stacking the various layers. The upper conductive layer 191, similar to the middle conductive layer 185, may be patterned using an etching technique to form openings 193 for the capacitors and inductors of the harmonic termination integrated passive device 150 and to form transmission lines 195 to connect the input terminal of the harmonic termination integrated passive device 150 to the capacitors and inductors. In some embodiments, the openings 187, 193 may be vertically aligned, for example to form the embedded parallel capacitive plates.

The upper substrate layer 189 may have a width that is slightly greater than the width of the lower conductive layer 183, the lower substrate layer 181, and the middle conductive layer 185. The width of the upper substrate layer 189 would match the width of the transistor 167, which may vary from 0.5 mm to 5 mm depending on the size of a single transistor cell.

Figure 5C:
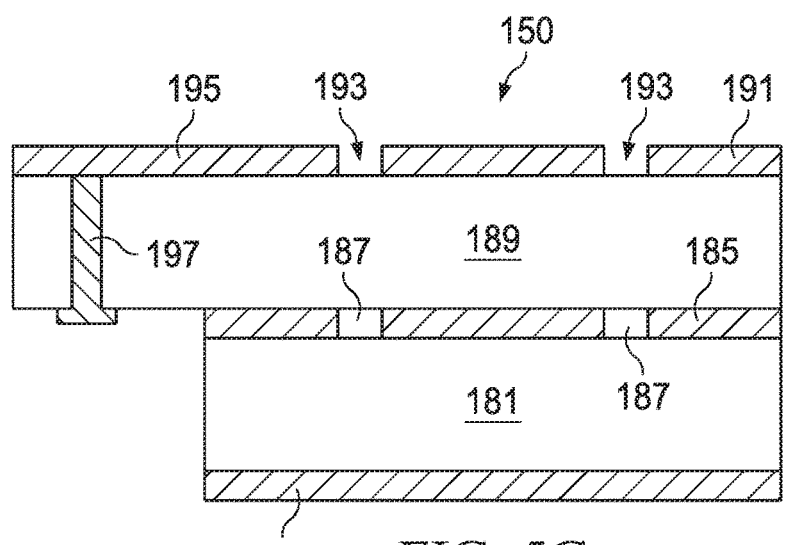

FIG. 5C illustrates a cross-sectional view of the harmonic termination integrated passive device 150 after forming vias 197 in the upper substrate layer 189. The extended width of the upper substrate layer 189 in effect creates an overhang region in at least one portion of the harmonic termination integrated passive device 150. In the overhang region, vias 197 are formed in the upper substrate layer 189 to provide electrical coupling between the upper conductive layer 191, the transmission line 195, and an exposed surface of the upper substrate layer 189 in the overhang portion. The vias 197 may be formed using a laser drilling process followed by electroplating with a conductive material. In some embodiments, the conductive material of the vias 197 is a metal such as copper (CU).

The upper conductive layer 191 may be of a similar material as the middle conductive layer 185 and the lower conductive layer 183. In some embodiments, the upper conductive layer 191 may be copper (CU).

The upper substrate layer 189 may be of a similar material as the lower substrate layer 181, such as a copper clad laminate. The sheets of the copper clad laminate material may be fabricated as single-sided or double-sided copper clad sheets. During fabrication, the copper sheets can be placed on one or both sides of a laminate material. In some embodiments, a double-sided copper clad laminate material may be used to form the laminate layers and to achieve a single-sided copper clad, the excess conductive surface can be etched off prior to lamination to a substrate. The etching of the conductive layer off the laminate material prior to lamination may improve adhesion to the substrate. The conductive surface may be an electrodeposited (ED) foil or a rolled foil by repeatedly feeding the foil sheet through rollers to evenly reduce the thickness of the foil sheet. The electrodeposited foil may be rigid and have a grain like texture. A rolled foil in contrast may be smooth and flexible, which can be advantageous when lesser surface roughness is desired.

The vertical thickness of the upper substrate layer 189 may be between 1 and 10 microns. As an example, in a harmonic termination integrated passive device 150 operating at a fundamental frequency of 2 GHz, the vertical thickness of the upper substrate layer 189 may be 10 microns. The vertical thickness of the upper substrate layer 189 may be selected to optimize the properties of the transmission lines 195 in the upper conductive layer 191. In some embodiments, the width of the transmission lines 195 may be between 400 and 800 microns. In a harmonic termination integrated passive device 150 operating at a fundamental frequency of 2 GHz, the width of the transmission lines 195 may be 750 microns. The transmission lines 195 may be referred to as the feeding circuits to the embedded capacitors and inductors of the harmonic termination integrated passive device 150.

Figure 6:
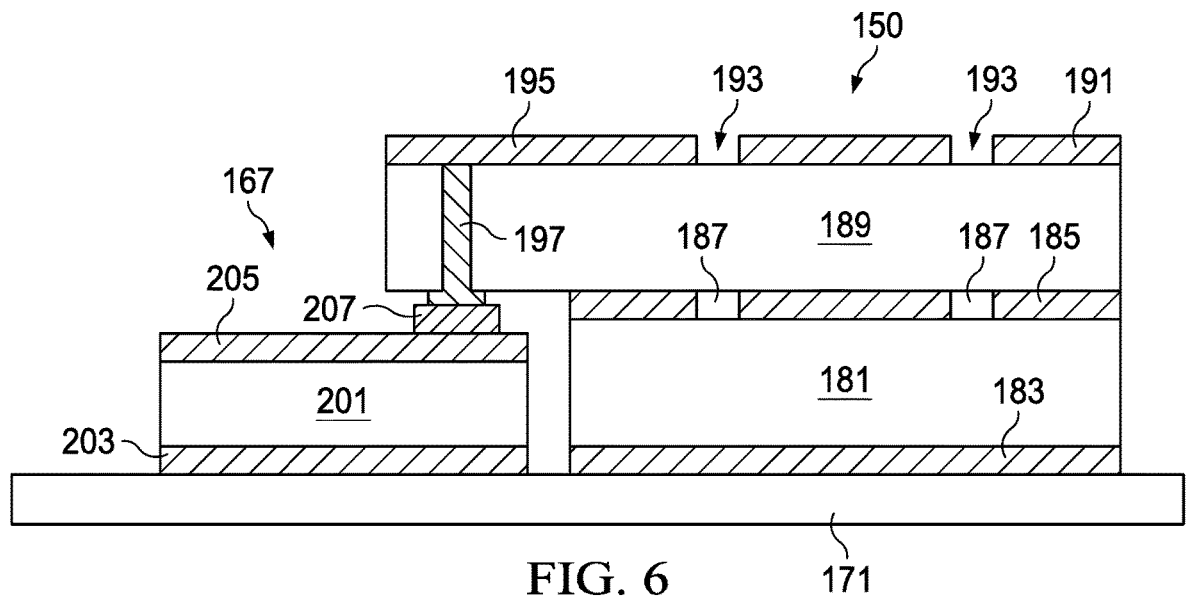
FIG. 6 illustrates a cross-sectional view of an embodiment harmonic termination integrated passive device and a transistor.

FIG. 6 illustrates a cross-sectional view of an embodiment harmonic termination integrated passive device 150 and a transistor 167 mounted on a conductive surface 171 of an RF device package 141 in an RF module 140. The transistor 167 may include a silicon substrate 201, a ground metallic conductive layer 203, and a top surface metallic conductive layer 205. In some embodiments, the transistor 167 may include additional layers. The transistor 167 is electrically connected to the upper conductive layer 191 through the vias 197 and a conductive material 207, such as a conductive epoxy.

In an embodiment, the transistor 167 is placed down on an exposed conductive surface 171 of the transistor package using for example conductive epoxy (e.g., silver epoxy) or solder. Once mounted, a small amount of conductive epoxy is placed on the top surface metallic conductive layer 205 of the transistor 167. The harmonic termination integrated passive device 150 is then placed on the exposed conductive surface 171 of the transistor package and near the transistor 167 such that the conductive material 207 on the top surface metallic conductive layer 207 makes contact with the vias 197. The malleability of the conductive material 207 compensates for the 1 to 2 um between the exposed metal of the vias 197 and the top surface metallic conductive layer 205, providing a continuous electrical contact between the transistor 167 and the harmonic termination integrated passive device 150.

In contrast to the limited number of bond wire 148 connections in a typical wirebond interconnect, the vias 197 are in effect many parallel bond wires having a much smaller inductance. Additionally, the mismatch and phase skew that results from the inconsistencies in the bond wire length and/or shape is minimized by the use of the vias 197 that have a known conductive length. As a result, the metal bus structure formed by the vias 197, provide a more controlled and more predictable transformation at the interconnect from the transistor 167 to the harmonic termination integrated passive device 150. The predictability and consistency of the transition provides a more ideal short circuit load at the second harmonic and a more ideal matching impedance at the fundamental operating frequency at the RF transition in comparison to the wirebond 148 interconnect of FIG. 4.

Figure 7:
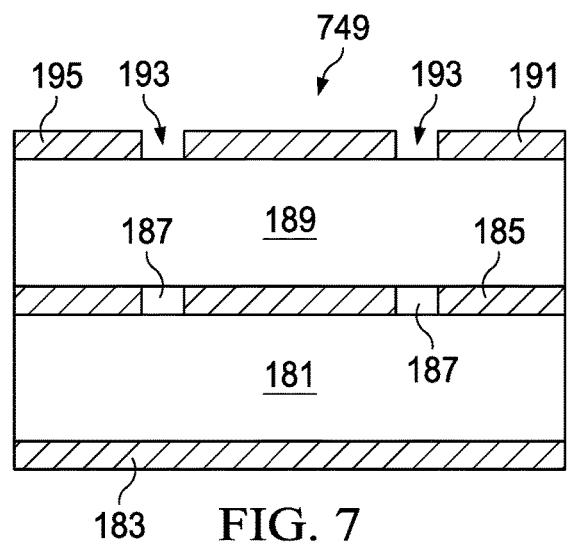
FIG. 7 illustrates a cross-sectional view of an embodiment harmonic termination integrated passive device without an overhang portion.

FIG. 7 illustrates a cross-sectional view of an embodiment harmonic termination integrated passive device 749 without an overhang portion. The harmonic termination integrated passive device 749 includes a lower conductive layer 183, a lower substrate layer 181, a middle conductive layer 185 having openings 187, an upper substrate layer 189, and an upper conductive layer 191 with openings 193. Unlike the harmonic termination integrated passive device 150 of FIGS. 5A-C and 6, the harmonic termination integrated passive device 749 of FIG. 7 does not have an overhang portion in the upper substrate layer 189 and upper conductive layer 191.

Figure 8A:
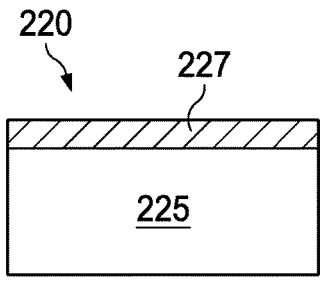
FIGS. 8A-C illustrate cross-sectional views of an embodiment passive interconnect device.

FIG. 8A illustrates a cross-sectional view of an embodiment passive interconnect device 220 after forming a lower conductive layer 227 over a first surface of a lower substrate layer 225. The lower conductive layer 227 may be a metal foil, a metal layer, or any type of metallization laminated to the lower substrate layer 225. In some embodiments, the lower conductive layer 227 is made of copper (CU). In an embodiment, the lower conductive layer 227 may be printed onto the lower conductive layer 227.

The lower substrate layer 225 may be of a similar material as the lower substrate layer 181 or upper substrate layer 189 of the harmonic termination integrated passive device 749 of FIG. 7, such as a copper clad laminate.

Figure 8B:
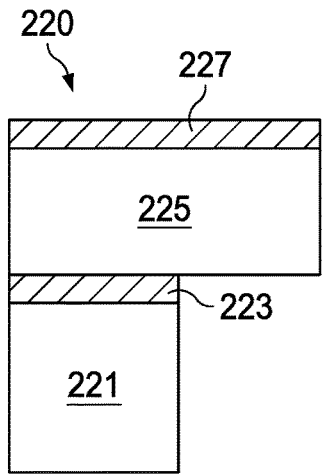

FIG. 8B illustrates a cross-sectional view of an embodiment passive interconnect device 220 after forming an upper conductive layer 223 over a second surface, opposing the first surface, of the lower substrate layer 225. The width of the upper conductive layer 223 is slightly less than the width of the lower conductive layer 227 and lower substrate layer 225. The upper conductive layer 223 may be printed or mask and etched onto the second surface of the lower substrate layer 225. An upper substrate layer 221 is then formed on the surface opposing the lower substrate layer 225 of the upper conductive layer 223. The width of the upper substrate layer 221 is close to the width of the conductive layer 223. The upper substrate layer 221 may be of similar material to the lower substrate layer 225. Likewise, the upper conductive layer 223 may be of similar material to the lower conductive layer 227.

Figure 8C:
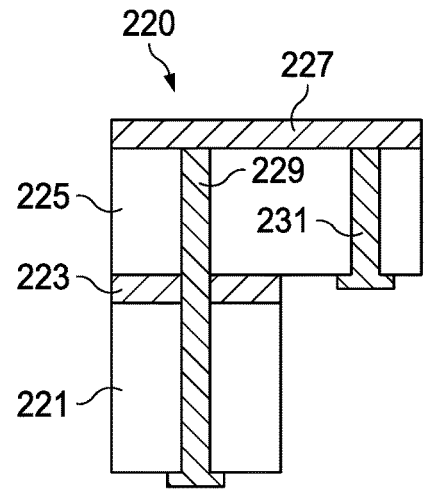

FIG. 8C illustrates a cross-sectional view of an embodiment passive interconnect device 220 after forming vias 229 in the lower substrate layer 225, upper conductive layer 223, and upper substrate layer 221. In addition, vias 231 are formed in the lower substrate layer 225. The vias 229 and 231 provide electrical coupling between the lower conductive layer 227 and the exposed surface of the upper substrate layer 221 and lower substrate layer 231 respectively. The vias 229 and 231 may be formed using a laser drilling process followed by an electroplating process using a conductive material such as copper (CU).

Figure 9:
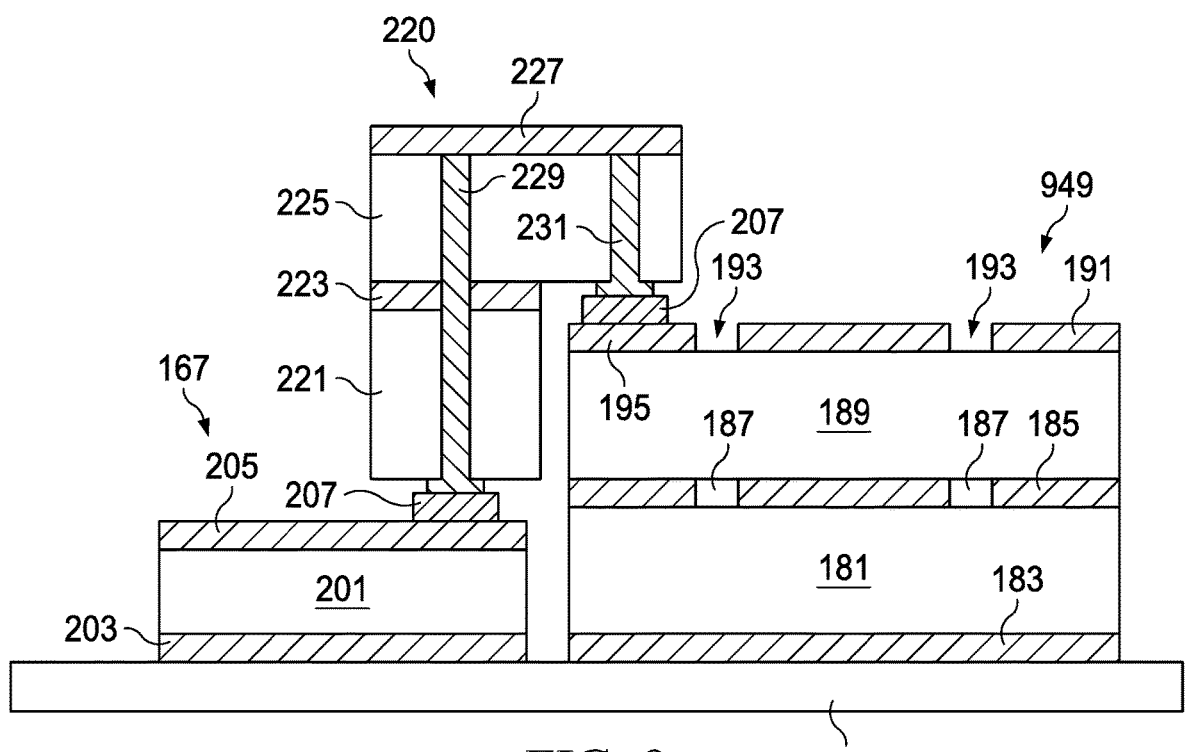
FIG. 9 illustrates a cross-sectional view of an embodiment harmonic termination integrated passive device, a passive interconnect device, and a transistor.

FIG. 9 illustrates a cross-sectional view of an alternative embodiment harmonic termination integrated passive device 150 making electrical contact with the transistor 167, in accordance with embodiments of this disclosure. In FIG. 9, the transistor 167 is electrically connected to the harmonic termination integrated passive device 949 using the passive interconnect device 220.

As illustrated, the transistor 167 and the harmonic termination integrated passive device 949 are mounted on an exposed conductive surface 171 of the transistor package using for example silvery epoxy or solder. In some embodiments, the two components are mounted at nearly the same time. In some embodiments, the transistor 167 and the harmonic termination integrated passive device 949 may be mounted at two different times, for example when one component is soldered and the other component is mounted using conductive epoxy. After the transistor 167 and the harmonic termination integrated passive device 949 have been mounted, a small amount of conductive epoxy 207 is placed on the top surface metallic conductive layer 205 of the transistor 167. Similarly, a small amount of conductive epoxy 207 is placed on a transmission line 195 formed by exposing the top conductive layer 191 with the holes 193. Subsequently, the passive interconnect device 220 is placed on the transistor 167 and the harmonic termination integrated passive device at the locations where the conductive epoxy has been placed and then cured.

Similar to the embodiment of FIG. 6, the embodiment of FIG. 9 advantageously provides for a predictable transition and a lower inductance at the transition between the transistor 167 and the harmonic termination integrated passive device 949 when compared to a wire bond transition, for example shown in FIG. 4.

Referring back to FIGS. 8A-C, the width of the substrate layers 225, 221 and conductive layers 227, 223 may be selected to account for tolerances in spacing between the transistor 167 and the harmonic termination integrated passive device 949. In addition, the height of the substrate layers 225, 221 may be selected to minimize the losses in the transition while accounting for the differences in height between the mounted transistor 167 and the harmonic termination integrated passive device 949. In some embodiments, the height and/or the width of the passive interconnect device 220 is chosen to have a minimum thickness and/or width to minimize transition losses.

Figure 10:
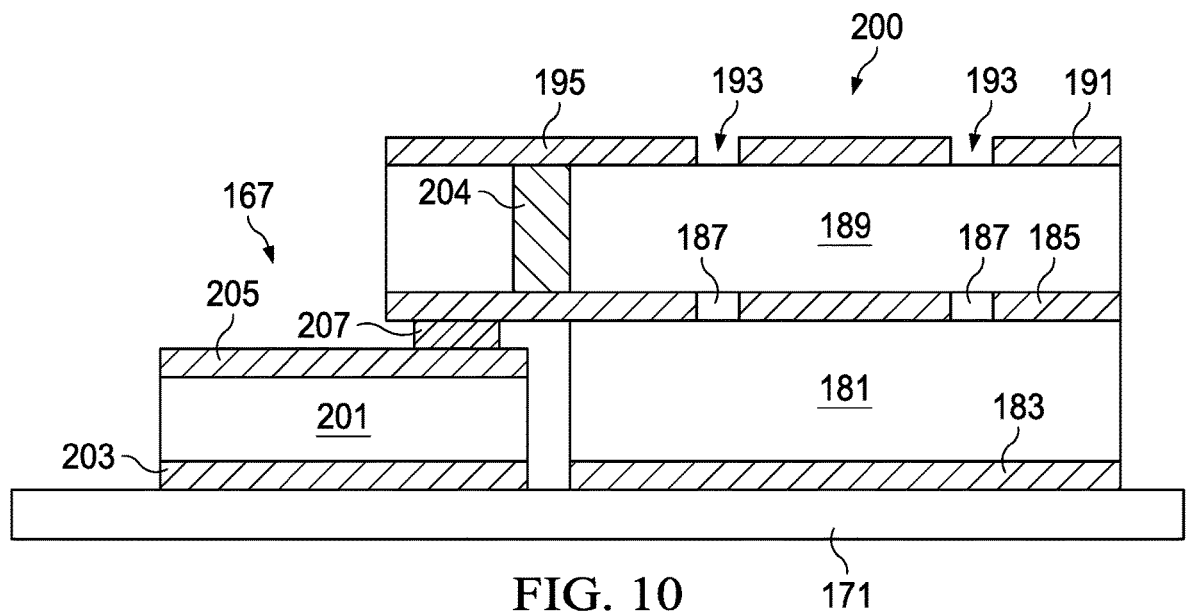
FIG. 10 illustrates a cross-sectional view of another embodiment harmonic termination integrated passive device and a transistor.

FIG. 10 illustrates a cross-sectional view of an embodiment harmonic termination integrated passive device 200 and a transistor 167 mounted on a conductive surface 171 of an RF device package 141 in an RF module 140. In FIG. 10, the overhang portion of the harmonic termination integrated passive device 200 has a similar structure as the harmonic termination integrated passive device 150 of FIG. 6, with the difference being that a metal wall type structure 204 replaces the vias 197. Similarly, the metal wall type structure 204 makes the electrical contact between the transistor 167 and the harmonic termination integrated passive device 200 possible.

Figure 11:
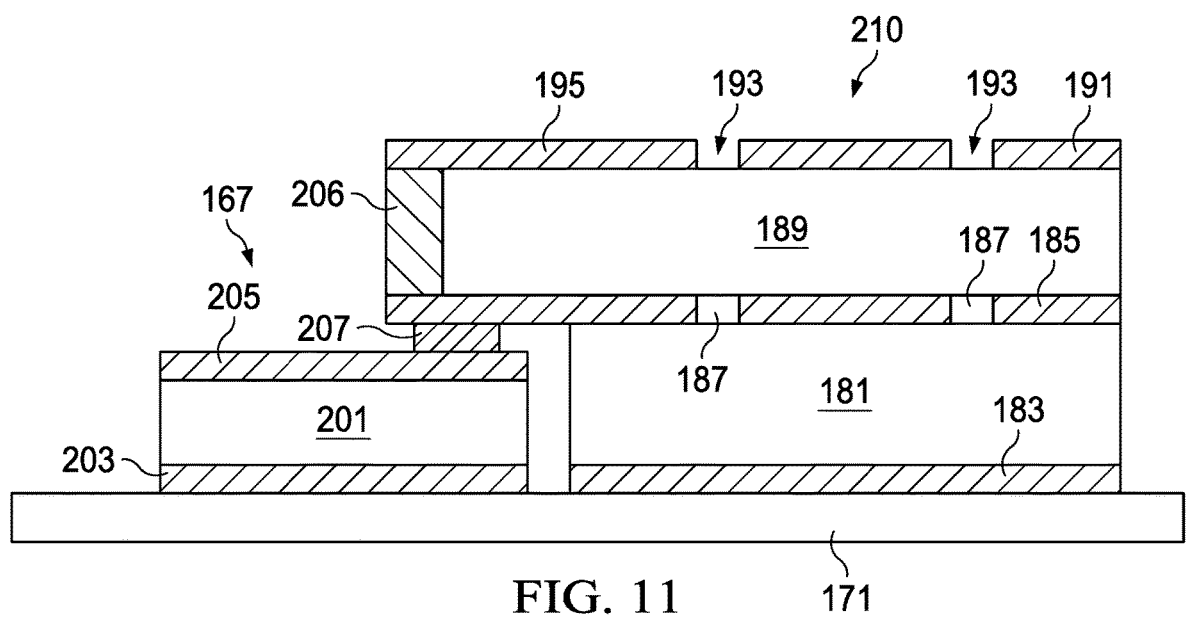
FIG. 11 illustrates a cross-sectional view of yet another embodiment harmonic termination integrated passive device and a transistor.

FIG. 11 illustrates a cross-sectional view of an embodiment harmonic termination integrated passive device 210 and a transistor 167 mounted on a conductive surface 171 of an RF device package 141 in an RF module 140. In Figure ii, the overhang portion of the harmonic termination integrated passive device 200 has a similar structure as the harmonic termination integrated passive device 150 of FIG. 6, with the difference being that a conductive edge plated portion 206 replaces the vias 197. The conductive edge plated portion 206 makes the electrical contact between the transistor 167 and the harmonic termination integrated passive device 200 possible.

Figure 12:
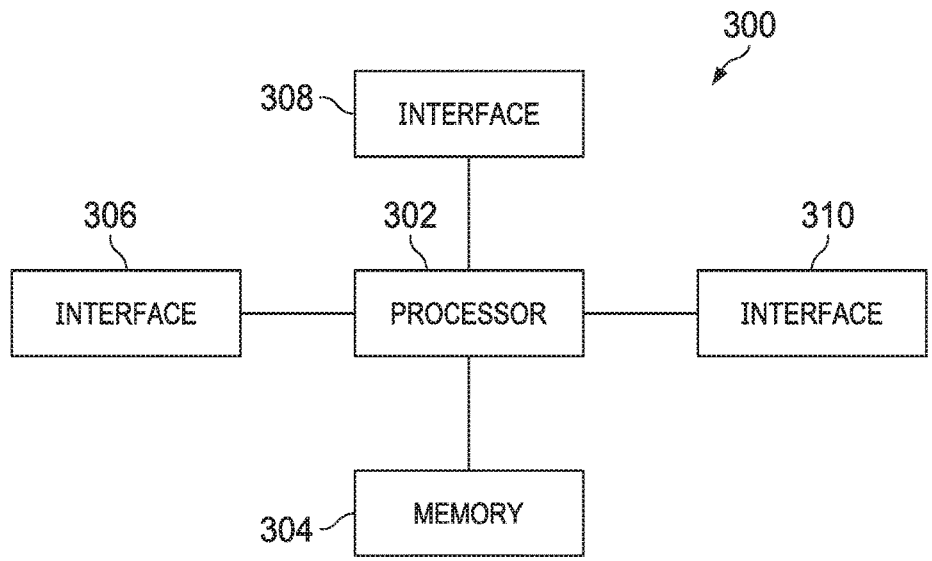
FIG. 12 is a diagram of an embodiment processing system.

FIG. 12 illustrates a block diagram of an embodiment processing system 300 for performing methods described herein, which may be installed in a host device. As shown, the processing system 300 includes a processor 302, a memory 304, and interfaces 306-308, which may (or may not) be arranged as shown in FIG. 12. The processor 302 may be any component or collection of components adapted to perform computations and/or other processing related tasks, and the memory 304 may be any component or collection of components adapted to store programming and/or instructions for execution by the processor 302. In an embodiment, the memory 304 includes a non-transitory computer readable medium. The interfaces 306, 308, 310 may be any component or collection of components that allow the processing system 300 to communicate with other devices/components and/or a user. For example, one or more of the interfaces 306, 308, 310 may be adapted to communicate data, control, or management messages from the processor 302 to applications installed on the host device and/or a remote device. As another example, one or more of the interfaces 306, 308, 310 may be adapted to allow a user or user device (e.g., personal computer (PC), etc.) to interact/communicate with the processing system 300. The processing system 300 may include additional components not depicted in FIG. 12, such as long-term storage (e.g., non-volatile memory, etc.).

In some embodiments, the processing system 300 is included in a network device that is accessing, or part otherwise of, a telecommunications network. In one example, the processing system 300 is in a network-side device in a wireless or wireline telecommunications network, such as a base station, a relay station, a scheduler, a controller, a gateway, a router, an applications server, or any other device in the telecommunications network. In other embodiments, the processing system 300 is in a user-side device accessing a wireless or wireline telecommunications network, such as a mobile station, a user equipment (UE), a personal computer (PC), a tablet, a wearable communications device (e.g., a smartwatch, etc.), a wireless capable vehicle, a wireless capable pedestrian, a wireless capable infrastructure element or any other device adapted to access a telecommunications network.

Figure 13:
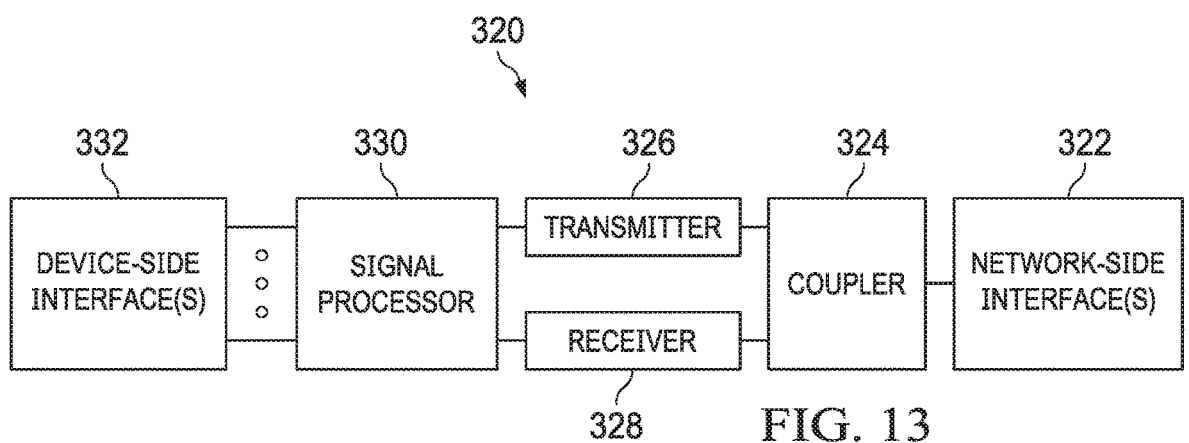
FIG. 13 is a diagram of an embodiment transceiver.

In some embodiments, one or more of the interfaces 306, 308, 310 connects the processing system 300 to a transceiver adapted to transmit and receive signaling over the telecommunications network. FIG. 13 illustrates a block diagram of a transceiver 320 adapted to transmit and receive signaling over a telecommunications network. The transceiver 320 may be installed in a host device. As shown, the transceiver 320 comprises a network-side interface 322, a coupler 324, a transmitter 326, a receiver 328, a signal processor 330, and a device-side interface 332. The network-side interface 322 may include any component or collection of components adapted to transmit or receive signaling over a wireless or wireline telecommunications network. The coupler 324 may include any component or collection of components adapted to facilitate bi-directional communication over the network-side interface 322. The transmitter 326 may include any component or collection of components (e.g., up-converter, power amplifier, etc.) adapted to convert a baseband signal into a modulated carrier signal suitable for transmission over the network-side interface 322. The receiver 328 may include any component or collection of components (e.g., down-converter, low noise amplifier, etc.) adapted to convert a carrier signal received over the network-side interface 322 into a baseband signal. The signal processor 330 may include any component or collection of components adapted to convert a baseband signal into a data signal suitable for communication over the device-side interface(s) 332, or vice-versa. The device-side interface(s) 332 may include any component or collection of components adapted to communicate data-signals between the signal processor 330 and components within the host device (e.g., the processing system 300, local area network (LAN) ports, etc.).

The transceiver 320 may transmit and receive signaling over any type of communications medium. In some embodiments, the transceiver 320 transmits and receives signaling over a wireless medium. For example, the transceiver 320 may be a wireless transceiver adapted to communicate in accordance with a wireless telecommunications protocol, such as a cellular protocol (e.g., long-term evolution (LTE), etc.), a wireless local area network (WLAN) protocol (e.g., Wi-Fi, etc.), or any other type of wireless protocol (e.g., Bluetooth, near field communication (NFC), etc.). In such embodiments, the network-side interface 322 comprises one or more antenna/radiating elements. For example, the network-side interface 322 may include a single antenna, multiple separate antennas, or a multi-antenna array configured for multi-layer communication, e.g., single input multiple output (SIMO), multiple input single output (MISO), multiple input multiple output (MIMO), etc. In other embodiments, the transceiver 320 transmits and receives signaling over a wireline medium, e.g., twisted-pair cable, coaxial cable, optical fiber, etc. Specific processing systems and/or transceivers may utilize all of the components shown, or only a subset of the components, and levels of integration may vary from device to device.

Although the description has been described in detail, it should be understood that various changes, substitutions and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps. The specification and drawings are, accordingly, to be regarded simply as an illustration of the disclosure as defined by the appended claims, and are contemplated to cover any and all modifications, variations, combinations or equivalents that fall within the scope of the present disclosure.

What is claimed is:

1. A radio frequency (RF) device comprising:
a first substrate and a second substrate, each substrate having a first surface and an opposing second surface, a thickness of the second substrate being greater than a thickness of the first substrate, the second substrate having an overhang portion extending over the first surface of the first substrate;
a first circuit disposed on the first substrate, the first circuit having a first contact terminal on the first surface of the first substrate;
a second circuit disposed on the second substrate, the second circuit having a second contact terminal on the first surface of the second substrate; and
an interconnect circuit disposed on the overhang portion of the second substrate, the interconnect circuit comprising a vertical metal structure electrically connecting the first contact terminal to the second contact terminal.

2. The RF device of claim 1, wherein the first circuit is an amplifier circuit, the first contact terminal is a control terminal of the amplifier circuit, the second circuit is a harmonic termination device, the harmonic termination device designed to provide a short circuit termination with a reflection coefficient of −1 at a second harmonic of a fundamental operating frequency of the amplifier circuit.

3. The RF device of claim 2, wherein the second substrate is a glass substrate and the harmonic termination device comprises capacitors and inductors formed using via structures and metal layers within the second substrate.

4. The RF device of claim 1, wherein the vertical metal structure is a metal plated via through hole.

5. The RF device of claim 1, wherein the vertical metal structure electrically connects the first contact terminal to the second contact terminal using a conductive epoxy.

6. The RF device of claim 5, wherein a thickness of the conductive epoxy is equal to a gap between the overhang portion of the second substrate and the first surface of the first substrate.

7. The RF device of claim 1, further comprising a plurality of isolation via structures on the overhang portion of the second substrate.

8. An electronic device comprising a first substrate, a second substrate, and a third substrate, each substrate having a first surface and an opposing second surface, a thickness of the second substrate being greater than a thickness of the first substrate, the electronic device further comprising;
    a first circuit disposed on the first substrate, the first circuit having a first contact terminal on the first surface of the first substrate;
    a second circuit disposed on the second substrate, the second circuit having a second contact terminal on the first surface of the second substrate; and
    an interconnect circuit disposed on the third substrate, the interconnect circuit comprising a vertical metal structure electrically connecting the first contact terminal to the second contact terminal.

9. The electronic device of claim 8, wherein the first circuit is an amplifier circuit, the first contact terminal is a control terminal of the amplifier circuit, the second circuit is a harmonic termination device, the harmonic termination device designed to provide a short circuit termination with a reflection coefficient of −1 at a second harmonic of a fundamental operating frequency of the amplifier circuit.

10. The electronic device of claim 9, wherein the harmonic termination device comprises capacitors and inductors formed using via structures and metal layers within the second substrate.

11. The electronic device of claim 8, wherein the second substrate and the third substrate are each a glass substrate.

12. The electronic device of claim 8, wherein the vertical metal structure is a metal plated via through hole.

13. The electronic device of claim 8, wherein the vertical metal structure electrically connects the first contact terminal to the second contact terminal using a conductive epoxy.

14. The electronic device of claim 8, wherein the vertical metal structure is a C shaped metal structure having a first surface, a second surface, and a third surface, wherein the first surface opposes the second surface and the third surface is perpendicular to the first surface and the second surface, each of the first surface, the second surface, and the third surface being metal plated.

15. A radio frequency (RF) device comprising:
    a first substrate comprising a contact terminal; and
    a second substrate comprising:
        a first surface and a second surface opposing the first surface;
        a first section located between the first surface and the second surface, the first section having a first width;
        a second section located between the first surface and the first section, the second section having a second width less than the first width; and
        a vertical metal structure electrically connecting the second surface of the second substrate to the contact terminal of the first substrate.

16. The RF device of claim 15, wherein the first substrate is an active device and the second substrate is a passive device.

17. The RF device of claim 15, wherein the first section overlaps the first substrate.

18. The RF device of claim 15, wherein the vertical metal structure is a metal plated via through hole.

19. The RF device of claim 15, wherein the vertical metal structure is electrically connected to the contact terminal of the first substrate using a conductive epoxy.

20. The RF device of claim 15, wherein the first substrate is a power amplifier, the contact terminal is a control terminal of the power amplifier, and the second substrate is a harmonic termination device designed to provide a short circuit termination with a reflection coefficient of −1 at a second harmonic of a fundamental operating frequency of the power amplifier.

\* \* \* \* \*